United States Patent
Jin

(10) Patent No.: US 9,742,386 B2
(45) Date of Patent: Aug. 22, 2017

(54) EFFICIENT DUTY-CYCLE BALANCED CLOCK GENERATION CIRCUIT FOR SINGLE AND MULTIPLE-PHASE CLOCK SIGNALS

(71) Applicant: Apple Inc., Cupertino, CA (US)

(72) Inventor: Haiming Jin, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 14/969,641

(22) Filed: Dec. 15, 2015

(65) Prior Publication Data

US 2017/0170814 A1  Jun. 15, 2017

(51) Int. Cl.
*H03H 11/26* (2006.01)
*H03K 5/15* (2006.01)

(52) U.S. Cl.
CPC ...................................... *H03K 5/15* (2013.01)

(58) Field of Classification Search
None
See application file for complete search history.

(56) References Cited

U.S. PATENT DOCUMENTS

| | | | |
|---|---|---|---|
| 6,603,337 B2 * | 8/2003 | Cho | H03K 5/133 327/149 |
| 7,765,425 B1 | 7/2010 | Searles et al. | |
| 7,839,194 B2 | 11/2010 | Chang et al. | |
| 7,999,589 B2 | 8/2011 | Lin | |
| 8,536,914 B2 * | 9/2013 | Oh | H03L 7/06 327/158 |
| 2001/0052805 A1 * | 12/2001 | Kim | H03K 5/133 327/156 |
| 2007/0205817 A1 | 9/2007 | Gomm et al. | |
| 2008/0272815 A1 * | 11/2008 | Yeo | H03K 5/1565 327/175 |
| 2009/0195287 A1 * | 8/2009 | Ho | G06F 1/06 327/298 |
| 2014/0028363 A1 * | 1/2014 | Lim | H03K 5/13 327/237 |
| 2015/0358001 A1 * | 12/2015 | Sridhar | H03K 5/1565 327/175 |

* cited by examiner

*Primary Examiner* — Cassandra Cox
(74) *Attorney, Agent, or Firm* — Meyertons, Hood, Kivlin, Kowert & Goetzel, P.C.; Erik A. Heter

(57) ABSTRACT

Clock generation circuits including a single and multi-phase clock circuits are disclosed. A clock generation circuit is coupled to receive a first pulse on a first input and a second pulse on a second input. The first pulse may be generated responsive to a rising edge of an input clock signal, while the second pulse may be generated responsive to a falling edge of the input clock signal. Responsive to the first pulse, an output node of the clock generation circuit may be pulled high. Responsive to the second pulse, the output node may be pulled low. During those points in which neither pulse is asserted, a state element in the clock generation circuit may hold the output node to its most recent value. Using delay elements and multiple instances of the clock generation circuit and pulse generation circuits, a multi-phase clock generation circuit may be constructed.

17 Claims, 7 Drawing Sheets

EFFICIENT DUTY-CYCLE BALANCED CLOCK GENERATION CIRCUIT FOR SINGLE AND MULTIPLE-PHASE CLOCK SIGNALS

BACKGROUND

Technical Field

This disclosure is directed to integrated circuits, and more particularly, circuits for generating clock signals used in integrated circuits.

Description of the Related Art

Integrated circuits having sequential logic utilize clock signals to synchronize operation. The clock signals may be generated using various types of clock circuits, such as oscillators, phase locked loops, and so forth.

In some synchronous circuits, multiple clock signals may be utilized. Moreover, in some cases, the multiple clock signals may have different phase relationships with respect to one another relative to a reference clock signal. For example, clock signals having phase differences of 45°, 90°, 135°, 180°, and so forth may be generated. Accordingly, clock circuits may be implemented to generate these clock signals. One type of circuit that could be used to generate multiple clock signals having different phases is a delay locked loop (DLL). A DLL may include multiple tap points. Respective clock signals having different phase relationships with respect to a reference clock signal provided as an input to the DLL may be provided.

SUMMARY

Clock generation circuits including a single and multi-phase clock circuits are disclosed. In one embodiment, a clock generation circuit is coupled to receive a first pulse on a first input and a second pulse on a second input. The first pulse may be generated responsive to a rising edge of an input clock signal, while the second pulse may be generated responsive to a falling edge of the input clock signal. Responsive to the first pulse, an output node of the clock generation circuit may be pulled high. Responsive to the second pulse, the output node may be pulled low. During those points in which neither pulse is asserted, a state element in the clock generation circuit may hold the output node to its most recent value. Using delay elements and multiple instances of the clock generation circuit and pulse generation circuits, a multi-phase clock generation circuit may be constructed.

In one embodiment, a multi-phase clock generation circuit may receive an input clock signal and produce a number of different clock signals. Each of the different clock signals may have a unique phase relationship to the input clock signal. The multi-phase clock generation circuit may be implemented using a number of the clock generation circuits discussed above, a number of pulse generation circuits, and a number of delay elements. The input clock signal may be propagate through a chain of serially coupled delay elements. Respective pulse generation circuits are coupled to corresponding outputs of at least a subset of the delay elements. Each input of each clock generation circuit is coupled to a corresponding pulse generation circuit, and arranged such that the pulses are received substantially 180° apart. The delay elements of the subset may be adjustable delay elements. The multi-phase clock generation circuit includes a phase detector that receives two clock signals, a 0° clock signal and a 360° clock (i.e. on that is delayed by a full cycle). Depending on any detected phase difference, the phase detector may increase or decrease the delay provided by the delay elements in order to maintain the phase relationships of the output clock signals.

BRIEF DESCRIPTION OF THE DRAWINGS

The following detailed description makes reference to the accompanying drawings, which are now briefly described.

Figure 1:
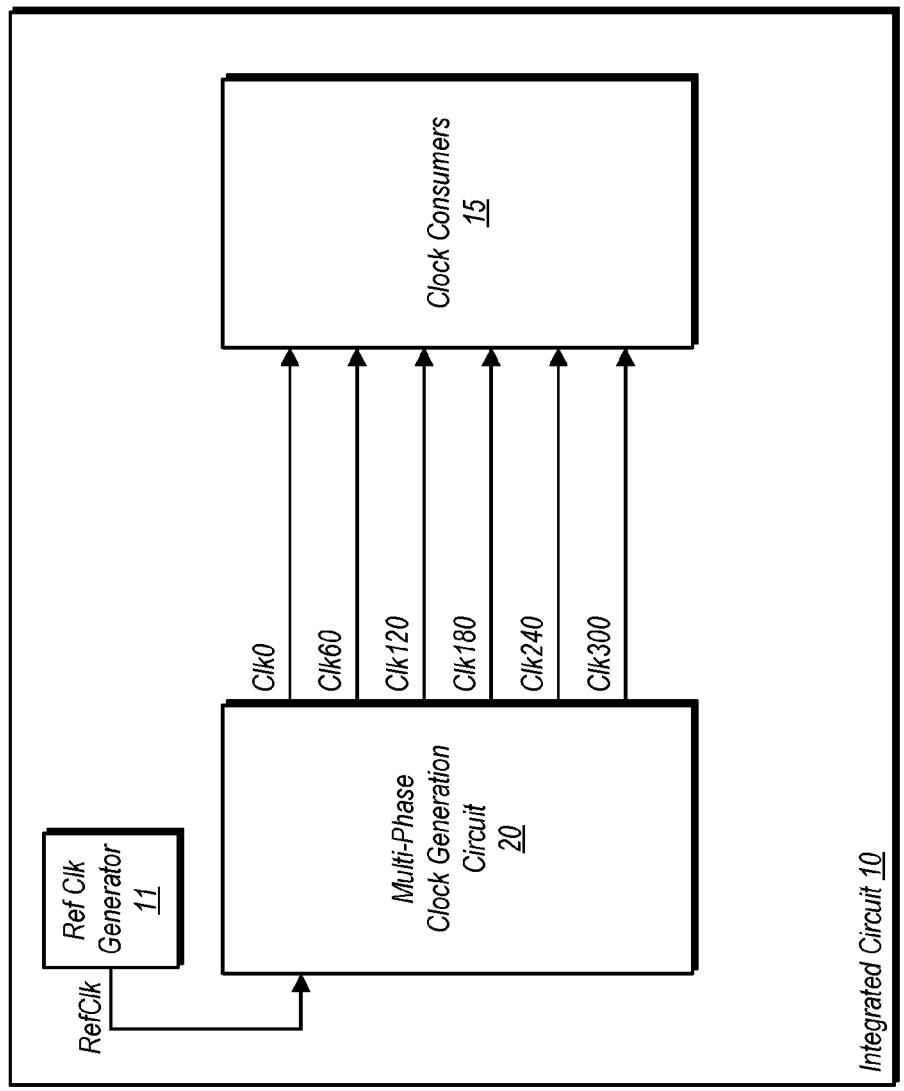
FIG. 1 is a simplified block diagram of one embodiment of an integrated circuit.

While the disclosed subject matter is susceptible to various modifications and alternative forms, specific embodiments thereof are shown by way of example in the drawings and will herein be described in detail. It should be understood, however, that the drawings and detailed description thereto are not intended to limit the subject matter to the particular form disclosed, but on the contrary, the intention is to cover all modifications, equivalents and alternatives falling within the spirit and scope of the disclosed subject matter as defined by the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include", "including", and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits and/or memory storing program instructions executable to implement the operation. The memory can include volatile memory such as static or dynamic random access memory and/or nonvolatile memory such as optical or magnetic disk storage, flash memory, programmable read-only memories, etc. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. §112, paragraph (f) (or pre-AIA paragraph six) interpretation for that unit/circuit/component.

DETAILED DESCRIPTION OF EMBODIMENTS

Turning now to FIG. 1, a simplified block diagram of one embodiment of an integrated circuit is shown. It is noted that the embodiment shown in FIG. 1 is intended for illustrative purposes, but is not intended to be limiting.

In the embodiment shown, integrated circuit 10 includes a number of circuits within the block labeled clock consumers 15. These circuits may include sequential logic circuits, various types of memory, and any other type of circuitry that utilizes a clock signal. The clock consumers 15 in the embodiment shown are arranged such that various circuits therein utilize a clock signal that has a unique phase relationship to a reference clock signal, RefClk, produced by reference clock generator 11.

The clock signals received by clock consumers 15 are produced by multi-phase clock generation circuit 20. In this particular embodiment, multi-phase clock generation circuit 20 produces six different clock signals: Clk0, Clk60, Clk120, Clk180, Clk240, and Clk300. These numbers correspond to the various phase relationships of the clock signals, as well as their phase differences with respect to the first output clock signal, Clk0. Accordingly, Clk60 is delayed by 60° with respect to Clk0, Clk120 is delayed by 120°, and so on. It is noted that the number of clock signal may vary from one embodiment to the next, and thus the example shown here is but one of a number of possible embodiments.

In general, the number of clock signals output by multi-phase clock generation circuit 20 may be up to 2n, wherein n is an integer number. The first clock signal will be OutClk0, and the final clock signal will be OutClk2n−1. This is discussed in further detail below with reference to FIG. 6.

Figure 2:
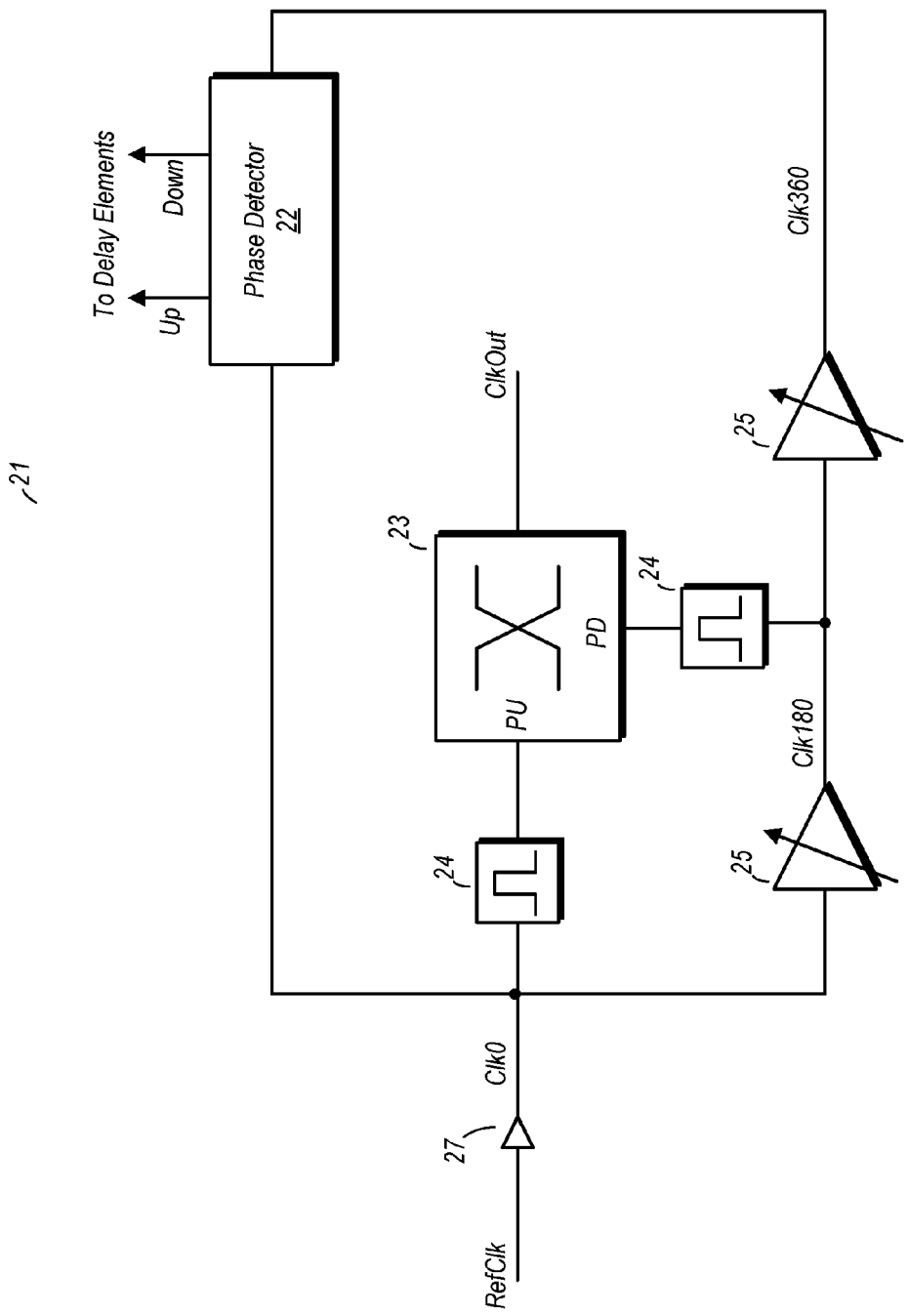
FIG. 2 is a diagram illustrating one embodiment of a single-phase clock generation circuit.

FIG. 2 is a diagram illustrating one embodiment of a single-phase clock generator circuit. In the embodiment shown, single-phase clock generator 21 includes a clock generation circuit 23 that includes two inputs, PU (pull-up) and PD (pull-down) and an output, ClkOut, from which the output clock signal is provided. A reference clock, RefClk, is provided to single-phase clock generator 21, at buffer 27, which outputs a clock signal, Clk). The Clk0 signal is provided to a first pulse generation circuit 24, to phase detector 22, and first delay element 25.

Responsive to receiving a rising edge of Clk0, the correspondingly coupled pulse generation circuit 24 asserts a pulse that is provided to the PU input of clock generation circuit 23. Responsive to receiving the pulse from pulse generation circuit 24, clock generation circuit causes its output, ClkOut, to transition high. As is discussed below, clock generation circuit 23 is configured to maintain the output high after the corresponding pulse generation circuit 24 no longer asserts a pulse onto the PU input.

In this embodiment, the first delay element 25 received clock 0 and applies a half-cycle, or 180° delay to produce Clk180. Responsive to receiving a rising edge of Clk180, the second pulse generation circuit 24 provides a pulse to the PD input of clock generation circuit 23. Responsive to receiving the pulse on the PD input, clock generation circuit 23 pulls ClkOut low. Clock generation circuit 23 is configured to maintain ClkOut as low even after the pulse is no longer asserted to the PD input by the correspondingly coupled pulse generation circuit 24.

The Clk180 signal is received by a second delay element 25, which adds another half cycle delay to output Clk360. The Clk360 signal is effectively the Clk0 signal delayed by one full cycle. Ideally, these two clock signals will have zero phase difference. However, in practice, it is possible for drift to occur, resulting in some phase error between the two. Phase detector 22 is configured to detect this error and to provide signals to cause adjustment of the delay provided by the delay elements 25 in order to reduce the phase difference to the minimum amount possible.

Both Clk0 and Clk360 are provided to phase detector 22. Based on the direction of any phase difference between Clk0 and Clk360, phase detector may increase the delay of delay elements 25 (Up), or reduce the delay (Down). If the rising edge of Clk0 arrives prior to the rising edge of Clk360, it indicates that the delay is too large and phase detector 22 asserts the Down signal. If the rising edge of Clk0 arrives after the rising edge of Clk360, it indicates that the delay is insufficient, and phase detector 22 asserts the Up signal. In this manner, the duty cycle of ClkOut may be precisely controlled within a small range, reducing jitter and duty cycle distortion.

Figure 3:
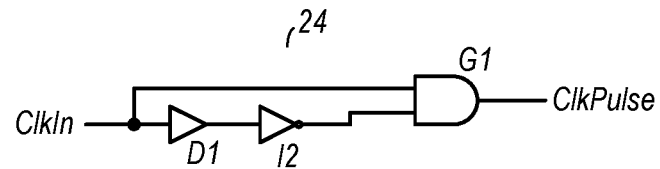
FIG. 3 is a logic diagram of one embodiment of a pulse generation circuit.

FIG. 3 illustrates on embodiment of a pulse generation circuit 24. In the embodiment shown, pulse generation circuit 24 is implemented using an AND gate, G1, a delay element D1, and an inverter I2. Delay element D1 and inverter I2 are coupled together in series as shown. The input clock signal (labeled here as "ClkIn") is provided to a first input of G1 and to an input of D1. Upon receiving a rising edge of the ClkIn, the second input of G1 is already high, and thus the output of pulse generation circuit 24, ClkPulse, goes high. The rising edge of ClkIn propagates through D1 to the input of I2, which causes its output to transition low. When the low output from I2 is received at the second input of G1, the output of pulse generation circuit 24 falls low.

Figure 4:
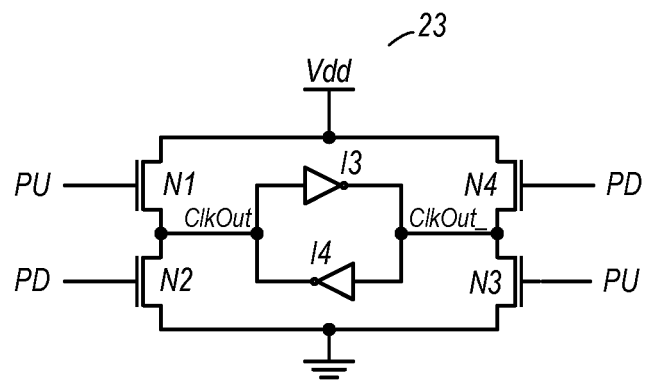
FIG. 4 is a schematic diagram of one embodiment of a duty-cycle correction clock generation circuit.

FIG. 4 is a schematic diagram of one embodiment of clock generation circuit 23. In this particular embodiment, clock generation circuit 23 is implemented using NMOS (N-channel metal oxide semiconductor) transistors to form pull-up and pull-down circuits, and also includes a pair of cross-coupled inverters, I3 and I4, to implement a state element. Transistors N1 and N3 are coupled to the PU input. When a pulse is received on this input, N1 activates to pull up the output node, ClkOut, while N3 activates to pull down the complementary output node, ClkOut_. When a pulse is received on the PD input, transistor N2 is activated to pull down ClkOut, while N4 activates to pull up ClkOut_. When no pulse is asserted on either of the PU or PD inputs, the state element comprising cross-coupled inverters I3 and I4 hold the respective values of ClkOut and ClkOut_.

Figure 5:
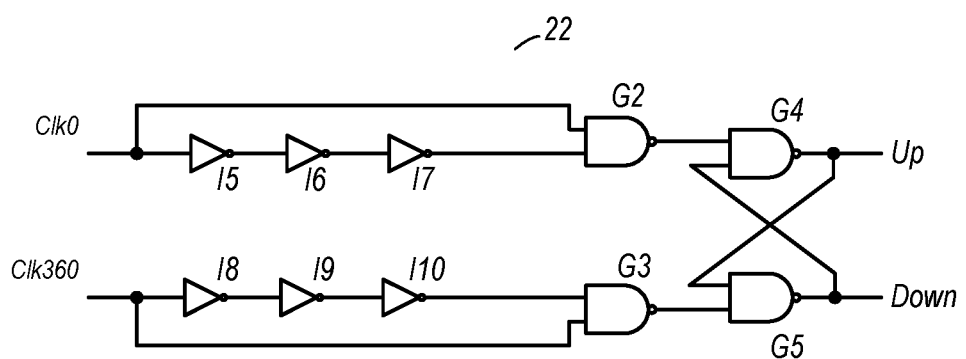
FIG. 5 is a logic diagram of one embodiment of a phase detector circuit.

FIG. 5 is a logic diagram of one embodiment of a phase detector. In the embodiment shown, logic gate G2 (a NAND gate) is coupled to receive Clk0 directly on one input, and an inverted version of Clk0 on its second input via a delay line including serially coupled inverters I5, I6, and I7. Similarly, gate G3 (also a NAND gate) is coupled to receive Clk360 directly on one input, and a complement thereof on the other input via the delay line that includes serially coupled inverters I8, I9, and I10. Based on the arrangement of their respectively coupled inputs, the outputs of both G2 and G3 will change responsive to receiving a rising edge of their respective output signals. The outputs of NAND gates G4 and G5 may also change, depending on which clock signal's rising edge is the first to arrive.

When the rising edge of CLK0 arrives first, indicating that there is too much delay between Clk0 and Clk360, the Down signal is asserted. The Down signal may be provided to adjustable delay elements in the clock generation circuitry, thereby causing the desired reduction in delay. When the rising edge of clock 360 arrives first, indicating that there is insufficient delay, the Up signal is asserted, causing the desired increase in delay provided by the adjustable delay elements.

In actual operation, phase detector 22 may alternately assert the Up and Down signals such that the delay provided by the adjustable delay elements is under near-constant adjustment. However, over time, the window of delay over which the delay elements are adjusted may converge to a very small value, thereby minimizing the jitter and duty cycle distortion of the clock signals produced by the clock generation circuit in which phase detector 22 is implemented.

Figure 6:
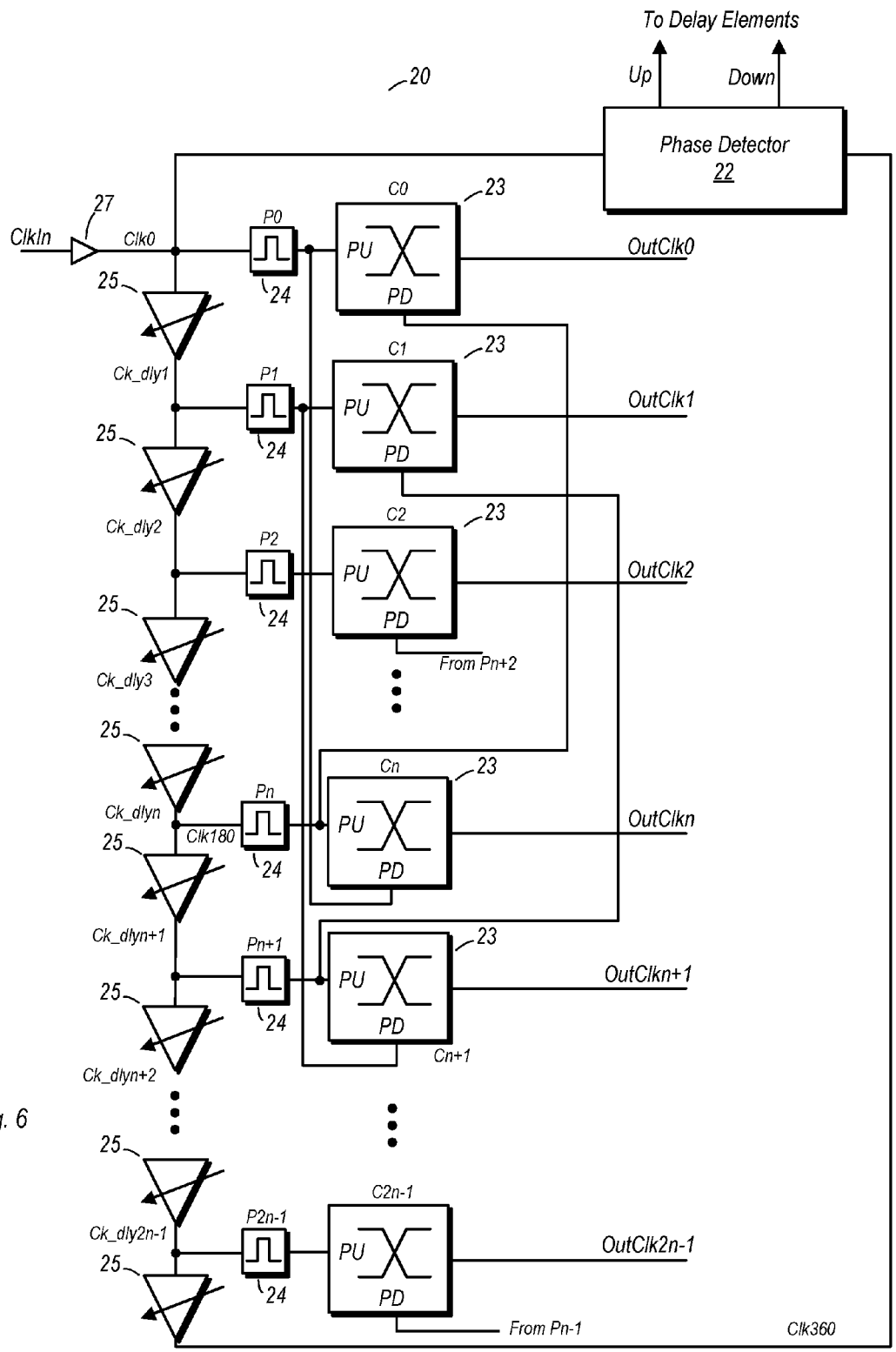
FIG. 6 is a diagram illustrating one embodiment of a multi-phase clock generation circuit.

FIG. 6 is a diagram of one embodiment of a multi-phase clock generation circuit. More particularly, multi-phase clock generation circuit 20 as shown in FIG. 6 illustrates the scalability of the single-phase clock generation circuit 21 shown in FIG. 2 to generate multiple clock signals with different phase relationships.

In the embodiment shown, the Clk0 signal is input into a chain of serially coupled delay elements 25. The number of delay elements is chosen to effectively divide a single cycle of the clock signal into 2n equal latency segments, wherein n is an integer number. The 0° phase clock signal, Clk0, is based on the clock signal ClkIn, received via buffer 27. The Clk0 signal is input into a first pulse generation circuit 24, phase detector 22, and a first adjustable delay element 25 in the serially-coupled chain of delay elements.

At the output of all but the last delay element 25, the corresponding phase of the clock signal (e.g., Ck_dly1, Ck_dly2, etc.) is output to a correspondingly coupled pulse generation circuit 24. Each pulse generation circuit 24 in the embodiment shown is coupled to a PU input of a first clock generation circuit 23 in order to put into effect the high phase portion of a corresponding output clock signal (e.g., Out-Clk0). Furthermore, the output of a number of pulse generation circuits is coupled to the PD input of another clock generation circuit 23 in order to put into effect the low phase portion of another output clock signal. For example, the first pulse generation circuit 24 in the embodiment shown, P0, is coupled to provide a pulse to the PU input of the first clock generation circuit 23, C0, in order to generate the high portion of Clk0. The same pulse generation circuit 24 is also coupled to provide the pulse another clock generation circuit 23, Cn, to put into effect the low portion of OutClkn.

It is noted that OutClk0 and OutClkn are separated in phase by one half-clock cycle, or 180°. More generally, the assertion of a pulse by a given pulse generation circuit 24 in the embodiment shown, when coupled to the PU input of one clock generation circuit 23 and the PD input of another, will cause the generation of a high portion of a first output clock signal and the low portion of another output clock signal. The two output clock signals will be separated in phase by 180°.

In the embodiment shown, both the Clk0 and Clk360 clock signals are provided to phase detector 22. As explained above, these two clock signals ideally will arrive at phase detector 22 with no phase difference, as the latter is simply a version of the former delayed by a full cycle. However, since some phase differences are likely to exist due to inherent delays in the wiring, variations in process, voltage, and temperature, and so forth. Accordingly, phase detector 22 is configured to detect this delay and cause adjustments to the amount of delay provided by each delay element 25. When the rising edge of the Clk0 signal arrived prior to the rising edge of the Clk360 signal, phase detector 22 may cause a reduction in the amount of delay provided by each delay element 25. When the rising edge of Clk360 arrives prior to the rising edge of Clk0, phase detector 22 may cause an increase in the amount of delay provided by each delay element 25. The delay elements 25 shown here may be identically configured and are each adjusted by the same amount in order to keep the respective amount of delay provided by each substantially equal.

The circuit arrangement shown in FIG. 6 may allow for more precise generation of multiple clock signals of different phases while controlling the duty cycle of each than prior art circuits, such as DLLs. Whereas many prior art circuits rely solely on delay to produce clock signals of multiple-phases, the use of the clock generation circuits 23 shown herein may provide better control over the duty cycle of each generation clock signal. Jitter and duty cycle distortion may also be minimized as a result.

For applications such as DDR memory PHY, fine grain delay elements are readily available to perform alignment between input/output data and the strobe signal. A DLL's delay range is typically over one clock period. The circuits disclosed herein fits naturally into the design of a DLL at its output stage (and thus, instead of being used as an alternate to a DLL, the circuits discussed above may be used as a complement thereto). Therefore area overhead of this duty-cycle balancer is very small. Furthermore, the disclosed scheme combines duty-cycle correction calibration with delay calibration seamlessly into a single process, eliminating the need for separate calibrations and the complexity of input clock handling for the two-stage process. Hence this is an efficient design as compared to other stand-alone duty cycle correctors.

The design is also power efficient in that it does not require bias DC current demanded by the analog duty-cycle correctors, nor does it require high speed clocking required of many pulse width calibration based DCCs. In addition, the structure of the circuits delivers high power noise rejection.

Figure 7:
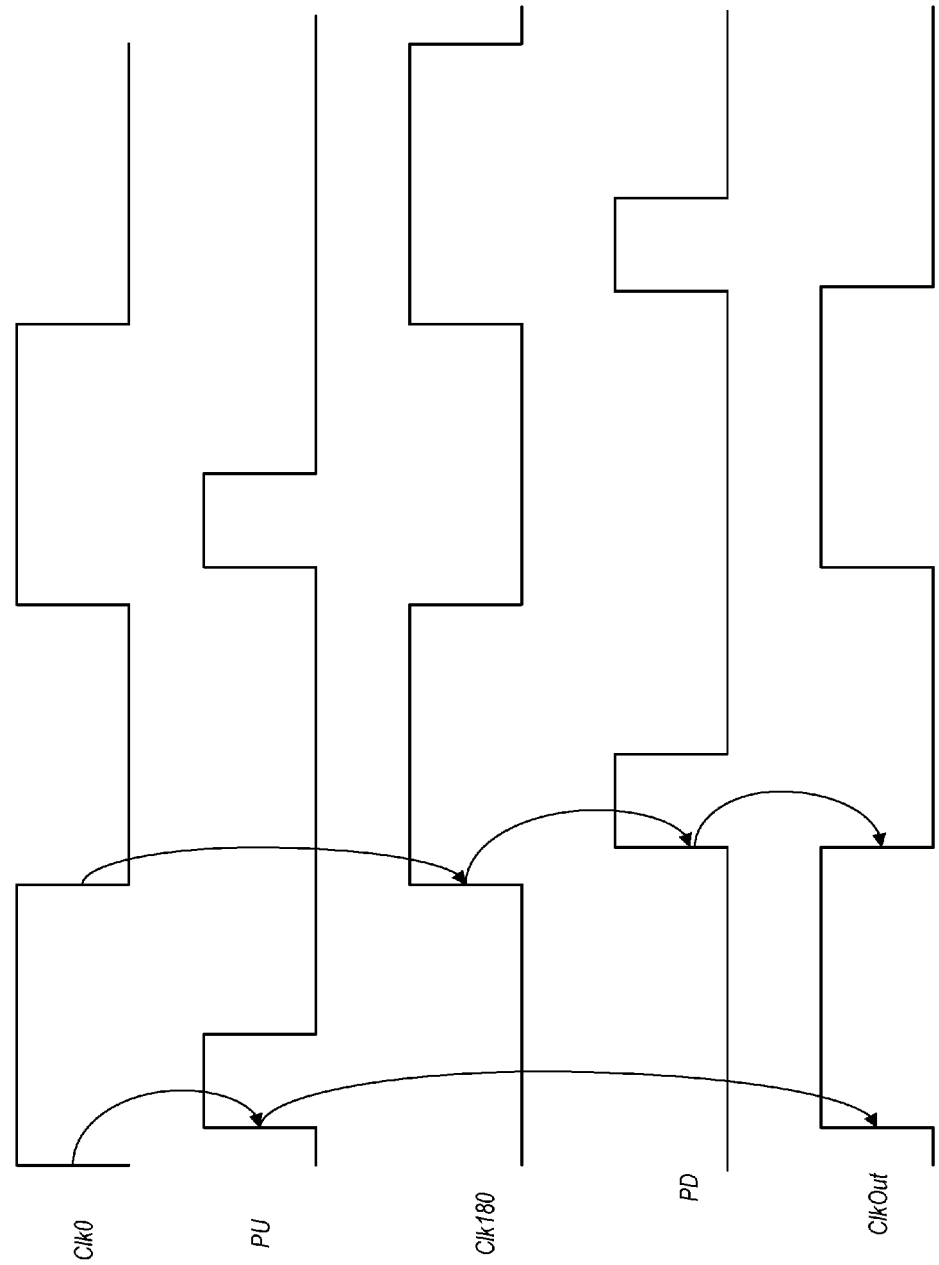
FIG. 7 is a timing diagram illustrating the operation of a single-phase clock generation circuit.

FIG. 7 is a timing diagram illustrating the operation of a single-phase clock generation circuit 21, such as that illustrated in FIG. 2. It is noted since the single-phase clock generation circuit discussed herein is scalable to form a multi-phase clock generation circuit as shown in FIG. 6, the operation illustrated by the timing diagram is repeated for each instance of a clock generation circuit 23, with the clock signals provided to the pulse generation circuits 24 having the appropriate phase relationships to Clk0. Since the illustrated example is directed to a single-phase clock generation circuit, Clk0 is provided as an input to one of the pulse generation circuits 24, while Clk180 is provided to the second pulse generation circuit 24.

Responsive to receiving Clk0, a first pulse generation circuit asserts a pulse on its output. The pulse is provided to the PU input of the clock generation circuit 23. Responsive to receiving the pulse on the PU input, the clock generation circuit 23 pulls its output node high, and thus ClkOut goes high. ClkOut will remain high even after the pulse on the PU input falls low due to the state element implemented in clock generation circuit 23.

Clk180 is a complement of Clk0 produced by delaying the latter by 180°. Accordingly, when Clk0 falls low, Clk180 goes high. Responsive to the transition of Clk180 from low to high, the pulse generation circuit 24 coupled to the PD input of the clock generation circuit 23 generates a pulse. Responsive to receiving this pulse on the PD input, the clock generation circuit 23 pulls the output node low, and thus ClkOut goes low. After the pulse on the PD input falls low, ClkOut is maintained low by the state element in clock generation circuit 23.

Figure 8:
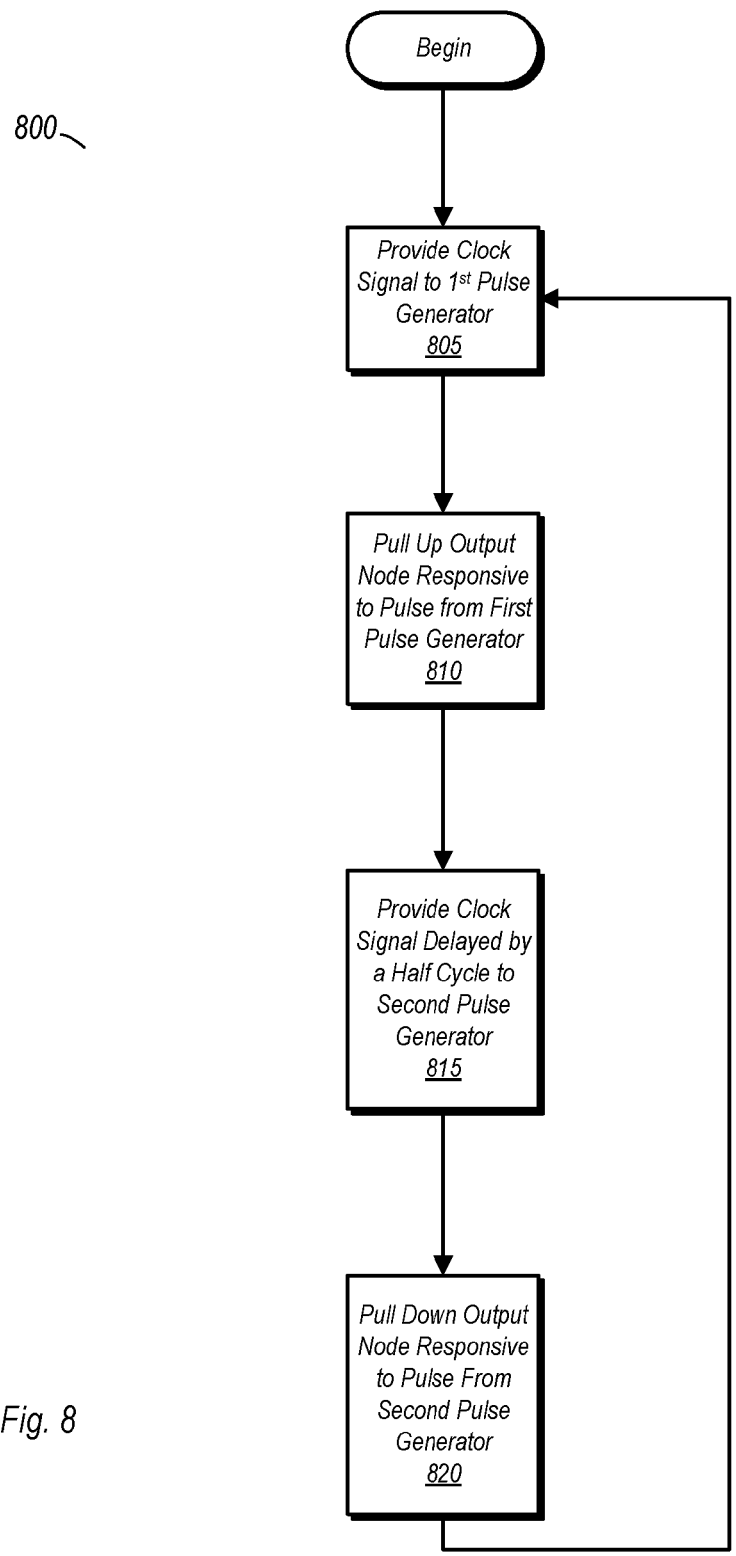
FIG. 8 is a flow diagram illustrating the operation of one embodiment of a single-phase clock generation circuit.

FIG. 8 is a flow diagram illustrating one embodiment of a method for operating a single-phase clock generation circuit such as the one illustrated in FIG. 2. As noted above with respect to FIG. 7, multiple instances of method 800 shown as shown here may be performed concurrently for each of the clock generation circuits implemented in a multi-phase clock generation circuit.

Method 800 begins with providing a clock signal to a first pulse generator (block 805). Responsive to receiving the clock signal, the first pulse generator may generate a pulse that is provided to first input of the clock generation circuit. Responsive to receiving the pulse on its first input, the clock generation circuit pulls up its output node (block 810). After the pulse falls low again, a state element in the clock generation circuit may maintain the output node at its current value.

The clock signal, after being delayed by one half cycle, may then be provided to a second pulse generator (block 815). Responsive thereto, the pulse generator may assert a pulse provided to a second input of the clock generation circuit. The clock generation circuit may in turn pull the output node low responsive to receiving the pulse (block 820). Thereafter, when the pulse falls low again, the state element of the clock generation circuit may hold the output node low until it is pulled high again during the next cycle of the input clock signal. After the output node is pulled low, method 800 returns to block 805 and repeats.

Figure 9:
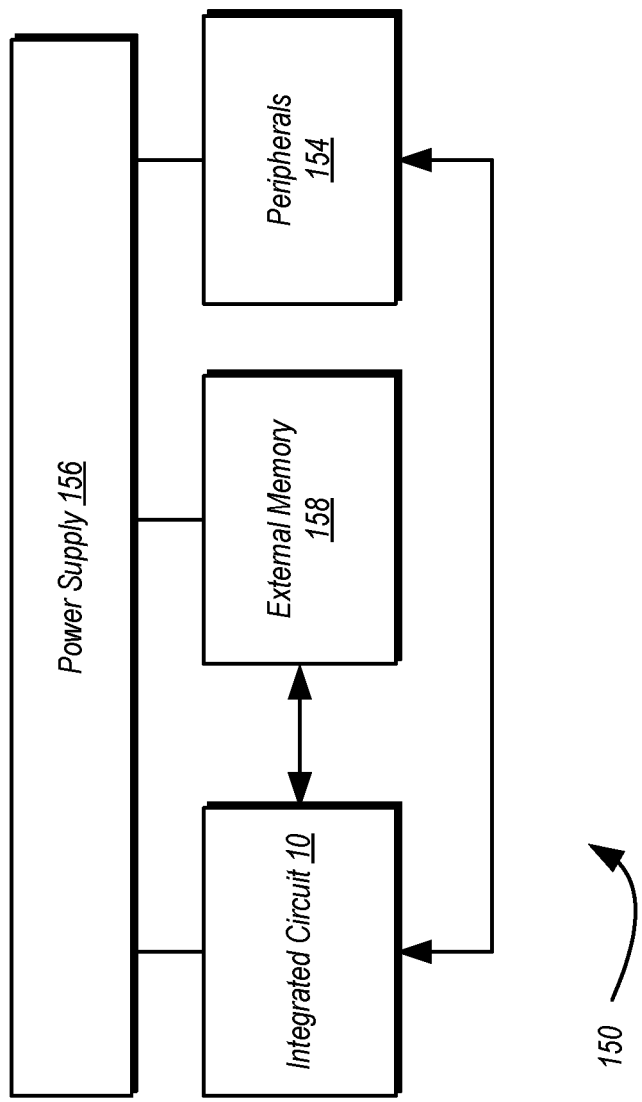
FIG. 9 is a block diagram of one embodiment of an exemplary system.

Turning next to FIG. 9, a block diagram of one embodiment of a system 150 is shown. In the illustrated embodiment, the system 150 includes at least one instance of an integrated circuit 10 coupled to external memory 158. The integrated circuit 10 may include a memory controller that is coupled to the external memory 158. The integrated circuit 10 is coupled to one or more peripherals 154 and the external memory 158. A power supply 156 is also provided which supplies the supply voltages to the integrated circuit 10 as well as one or more supply voltages to the memory 158 and/or the peripherals 154. In some embodiments, more than one instance of the integrated circuit 10 may be included (and more than one external memory 158 may be included as well).

The peripherals 154 may include any desired circuitry, depending on the type of system 150. For example, in one embodiment, the system 150 may be a mobile device (e.g. personal digital assistant (PDA), smart phone, etc.) and the peripherals 154 may include devices for various types of wireless communication, such as WiFi, Bluetooth, cellular, global positioning system, etc. The peripherals 154 may also include additional storage, including RAM storage, solid-state storage, or disk storage. The peripherals 154 may include user interface devices such as a display screen, including touch display screens or multitouch display screens, keyboard or other input devices, microphones, speakers, etc. In other embodiments, the system 150 may be any type of computing system (e.g. desktop personal computer, laptop, workstation, tablet, etc.).

The external memory 158 may include any type of memory. For example, the external memory 158 may be SRAM, dynamic RAM (DRAM) such as synchronous DRAM (SDRAM), double data rate (DDR, DDR2, DDR3, LPDDR1, LPDDR2, etc.) SDRAM, RAMBUS DRAM, etc. The external memory 158 may include one or more memory modules to which the memory devices are mounted, such as single inline memory modules (SIMMs), dual inline memory modules (DIMMs), etc.

Numerous variations and modifications will become apparent to those skilled in the art once the above disclosure is fully appreciated. It is intended that the following claims be interpreted to embrace all such variations and modifications.

What is claimed is:

1. A circuit comprising:
   a first pulse generator configured to generate a first pulse responsive to a rising edge of a first clock signal;
   a second pulse generator configured to generate a second pulse responsive to a rising edge of a second clock signal, wherein the second clock signal has a phase opposite that of the first clock signal, wherein the first clock signal is an input clock signal, and wherein the circuit further includes a plurality of delay elements, wherein at least a first subset of the plurality of delay elements is coupled between an input to the first pulse generator and an input to the second pulse generator and is configured to provide a total delay of one half of one cycle of the first clock signal in order to produce the second clock signal;
   a clock generation circuit configured to generate an output clock signal by setting an output clock node to a first state responsive to generation of the first pulse and setting the output clock node to a second state responsive to generation of the second pulse; wherein the clock generation circuit includes:
      first and second cross-coupled inverters, wherein an output of the first inverter and an input of the second inverter are each coupled to the output node;
      a pull-up circuit configured to pull the output node high responsive to receiving the first pulse; and
      a pull-down circuit configured to pull the output node low responsive to receiving the second pulse;
   wherein the circuit further comprises a second subset of the plurality of delay elements coupled between the input to the second pulse generator and a phase detector and configured to produce a third clock signal that is a version of the first clock signal delayed by a full cycle, wherein the phase detector is coupled to receive the first and third clock signals and configured to adjust a delay provided by each of the plurality of delay elements based on any phase difference between the first and third clock signals.

2. The circuit as recited in claim 1, wherein the first and second pulse generators are configured to produce respective pulses having pulse widths less than a duty cycle of the input clock signal.

3. An apparatus comprising:
   a plurality of pulse generation circuits;
   a plurality of clock generation circuits, wherein each of the clock generation circuits includes:
      a first input coupled to receive a respective first pulse from one of the plurality of pulse generation circuits, wherein each of the clock generation circuits includes a pull-up circuit configured to cause a corresponding output node to be pulled high responsive to receiving its respective first pulse; and
      a second input coupled to receive a respective second pulse from another one of the plurality of clock generation circuits, wherein each of the pulse generation circuits include a pull-down circuit configured to cause the corresponding output node to be pulled low responsive to receiving its respective second pulse;
   a plurality of serially-coupled delay elements, wherein a first one of the plurality of serially-coupled is coupled to receive an input clock signal, and wherein an output of each of the serially coupled delay elements is coupled to a corresponding one of the plurality of pulse generation circuits, and wherein at least a subset of the plurality of serially-coupled delay elements is configured to provide an adjustable amount of delay; and a phase detector coupled to receive first and second delayed versions of the input clock signal and configured to adjust the delay of each of the subset of delay elements such that each of the plurality of clock generation circuits is configured to provide a respective one of a plurality of output clock signals each having a unique phase relationship to each of the other output clock signals.

4. The apparatus as recited in claim 3, wherein the plurality of pulse generation circuits is arranged such that the second input of each of the plurality of clock generation circuits receives a pulse from its respectively coupled one of the plurality of pulse generation circuits one half clock cycle after the first input of each of the plurality of clock generation circuits receives a pulse from its respectively coupled one of the plurality of pulse generation circuits.

5. The apparatus as recited in claim 3, wherein each of the pulse generation circuits include an AND gate having first and second inputs, and a delay circuit, wherein the first input and the delay circuit are coupled to receive a version of the clock signal from a respectively coupled one of the plurality of delay elements, and wherein the second input of each pulse generation circuit is configured to receive an output from its respective delay circuit.

6. The apparatus as recited in claim 3, wherein each of the plurality of clock generation circuits includes a state element configured to hold the output node high after deactivation of the pull-up circuit and further configured to hold the output node low after deactivation of the pull-down circuit.

7. The apparatus as recited in claim 6, wherein the state element comprises a pair of cross-coupled inverters.

8. The apparatus as recited in claim 3, wherein the second delayed version of the clock signal received by the phase detector is delayed by a full clock cycle relative to the first delayed version of the clock signal.

9. The apparatus as recited in claim 3, wherein the phase detector is configured to:
reduce an amount of delay provided by each of the subset of the plurality of delay elements responsive to receiving a rising edge of the first delayed version of the clock signal prior to receiving a rising edge of the second delayed version of the clock signal; and
increase an amount of delay provided by each of the subset of the plurality of delay elements responsive to receiving the rising edge of the first delayed version of the clock signal subsequent to receiving the rising edge of the second delayed version of the input clock signal.

10. The apparatus as recited in claim 3, wherein the subset of the plurality of delay elements are arranged to divide the first delayed version of the clock signal into 2n delay segments, wherein n is an integer value, and wherein an output of a $2n^{th}$ delay element is the second delayed version of the input clock signal.

11. The apparatus as recited in claim 3, wherein each of the subset of the plurality of delay elements is configured to provide an amount of delay that is substantially equal to an amount of delay provided by each of the other ones of the subset of the plurality of delay elements.

12. The apparatus as recited in claim 3, wherein the phase detector is configured to cause the amount of delay to be adjusted by a substantially equal amount for each of the subset of the plurality of delay elements.

13. A method comprising:
providing a first clock signal to a first one of a plurality of serially-coupled delay elements and a first one of a plurality of pulse generation circuits;
providing, to a first input of each of a plurality of clock generation circuits, a respective first pulse from a first correspondingly coupled one of the pulse generation circuits, wherein each of the pulse generation circuits is coupled to an output of a corresponding one of the plurality of delay elements such that each clock generation circuit receives its respective first pulse at different times with respect to one another;
providing, to a second input of each of the plurality of clock generation circuits, a respective second pulse from a second correspondingly coupled one of the pulse generation circuits, wherein the plurality of delay elements and plurality of pulse generation circuits are arranged such each clock generation circuit receives its respective second pulse at different times with respect to one another;
generating, at each of the plurality of clock generation circuits, a respective clock signal responsive to receiving respective first and second pulses, wherein the clock signal generated by each of the plurality of clock generation circuits has a different phase with respect to the respective clock signals generated by each other one of the plurality of clock generation circuits.

14. The method as recited in claim 13, further comprising:
providing the first clock signal and a second clock signal to a phase detector, wherein the second clock signal is a version of the first clock signal delayed by one full cycle;
adjusting an amount of delay provided by each of the plurality of delay elements based on a phase difference of an edge of the first clock signal and a corresponding edge of the second clock signal.

15. The method as recited in claim 14, further comprising:
increasing an amount of delay provided by each of the plurality of delay elements responsive to receiving the edge of the first clock signal subsequent to receiving the corresponding edge of the second clock signal; and
reducing an amount of delay provided by each of the plurality of delay elements responsive to receiving the edge of the first clock signal prior to receiving the corresponding edge of the second clock signal.

16. The method as recited in claim 13, further comprising:
pulling a respective output node high at each of the plurality of clock generation circuits responsive to receiving its respective first pulse; and
pulling the respective output node low at each of the plurality of clock generation circuits responsive to receiving its respective second pulse.

17. The method as recited in claim 16, further comprising:
a state element in each of the plurality of clock generation circuits holding its respective output node high subsequent to receiving its respective first pulse; and
the state element in each of the plurality of clock generation circuits holding its respective output node low subsequent to receiving its respective second pulse.

* * * * *